(12) United States Patent
Kumar et al.

(10) Patent No.: US 10,288,871 B1
(45) Date of Patent: May 14, 2019

(54) ORGANIC MATERIAL LAYER AS LIGHT SHIELD FOR THIN FILM TRANSISTOR CHANNEL

(71) Applicant: AMAZON TECHNOLOGIES, INC., Seattle, WA (US)

(72) Inventors: Abhishek Kumar, Tilburg (NL); Toru Sakai, Waalre (NL)

(73) Assignee: Amazon Technologies, Inc., Seattle, WA (US)

( * ) Notice: Subject to any disclaimer, the term of this patent is extended or adjusted under 35 U.S.C. 154(b) by 25 days.

(21) Appl. No.: 15/194,073

(22) Filed: Jun. 27, 2016

(51) Int. Cl.
*G02B 26/00* (2006.01)
*G02B 26/08* (2006.01)
*G02F 1/29* (2006.01)
*H01L 27/12* (2006.01)
*H01L 29/786* (2006.01)
*H01L 29/66* (2006.01)
*H01L 21/027* (2006.01)

(52) U.S. Cl.
CPC ........ *G02B 26/005* (2013.01); *H01L 21/0274* (2013.01); *H01L 27/124* (2013.01); *H01L 27/1218* (2013.01); *H01L 27/1222* (2013.01); *H01L 27/1248* (2013.01); *H01L 27/1288* (2013.01); *H01L 29/66765* (2013.01); *H01L 29/78633* (2013.01); *H01L 29/78669* (2013.01)

(58) Field of Classification Search
CPC .... G02B 26/005; G02B 26/04; G02B 26/004; G02B 26/02; G02B 26/007; G02B 3/14; G02B 5/201
USPC ........ 359/237, 242, 265–267, 270–273, 315, 359/321, 290–292, 296, 298
See application file for complete search history.

(56) References Cited

U.S. PATENT DOCUMENTS 9,704,888 B2 * 7/2017 Chen ...................... H01L 27/124
2015/0241689 A1 * 8/2015 Sakai .................. G02B 26/005
359/290

* cited by examiner

*Primary Examiner* — Brandi N Thomas
(74) *Attorney, Agent, or Firm* — EIP US LLP

(57) ABSTRACT

A display device includes a first support plate and a pixel region over the first support plate. A thin film transistor (TFT) structure is disposed over the first support plate and associated with the pixel region. The TFT structure includes a first metal layer over the first support plate. The first metal layer includes a gate. A silicon layer is disposed over the gate. A second metal layer is disposed over the silicon layer. The second metal layer includes a source and a drain covering a first portion of the silicon layer. A light-absorbing material layer is disposed over at least a second portion of the silicon layer.

20 Claims, 6 Drawing Sheets

ORGANIC MATERIAL LAYER AS LIGHT SHIELD FOR THIN FILM TRANSISTOR CHANNEL

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the type and the purpose of the associated electronic device. The appearance and the quality of a display may affect a user's experience with the electronic device and the content presented thereon. Accordingly, enhancing user experience and satisfaction continues to be a priority.

At least some electronic display devices include a thin film transistor (TFT) structure having photosensitive electric components or layers. When light enters the display device, the light may propagate into the TFT structure and impinge on these electric components or layers, potentially causing the components to operate improperly and/or damaging the components.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1:
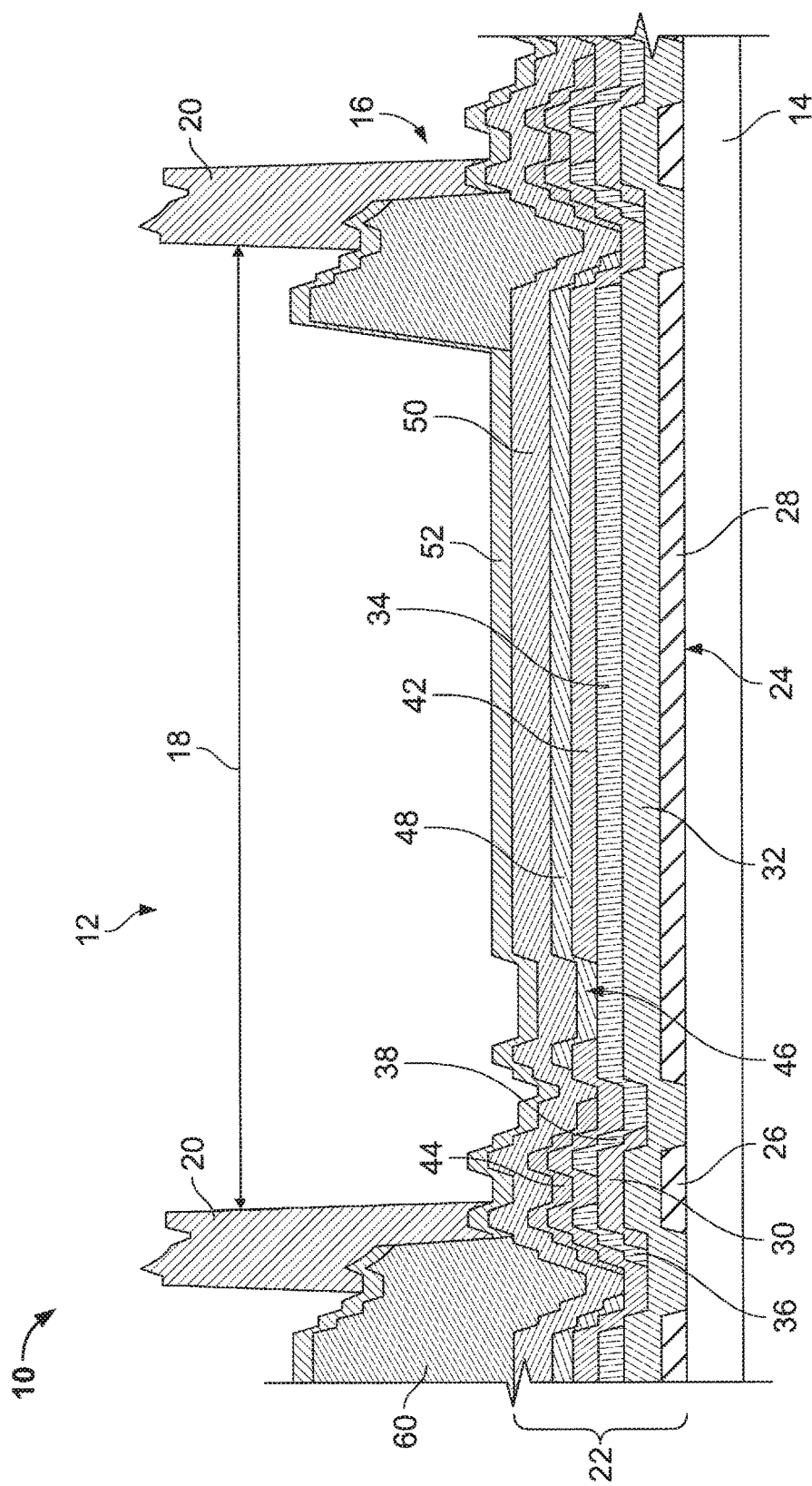
FIG. 1 is a cross-sectional view of a portion of an electrowetting pixel region of an example electrowetting display device, according to various embodiments.

In example embodiments described herein, a light-absorbing material layer, such as an organic material layer, e.g., a black matrix organic material layer, is disposed over a silicon layer of a TFT structure to shield the photosensitive silicon from potentially harmful exposure to light. The light-absorbing material layer can also be extended over other components of the TFT structure, such as a source line coupling a source of the TFT structure to a respective pixel region.

In many electrowetting display devices, a thin film transistor (TFT) structure includes a silicon layer, such as a semiconductor layer including amorphous silicon, which is highly photosensitive. When light passes through the display device, a portion of the light may pass into the TFT structure and impinge on the silicon. When this light leakage occurs, the TFT structure becomes conductive due to the photosensitivity of the silicon. As a result, the TFT structure no longer acts as a reliable switch to activate or deactivate an associated pixel and leakage current from the TFT structure may cause undesirable crosstalk between adjacent pixels, particularly under bright lighting conditions and/or during low frequency driving situations. More specifically, when the TFT structure is operating effectively as a switch, at a positive gate voltage, the TFT structure will activate the associated pixel. Conversely, at a negative gate voltage, the current through the TFT structure is essentially zero and the TFT structure will deactivate the associated pixel region preventing transmission of signals from an electrode layer, i.e., a gate electrode layer, of the TFT structure to the associated pixel region. However, as the TFT structure becomes conductive as a result of light leakage into the TFT structure, the TFT structure no longer acts as an effective switch to deactivate the associated pixel region and prevent current flow to the associated pixel. Generally, leakage current refers to a small amount of current that flows or leaks through a transistor, e.g., a TFT structure, when the transistor is turned off. In an ideal transistor, the leakage current is zero, but in practice, leakage current has a finite value. For example, leakage current causes the voltage in the pixel capacitor to either drop or increase between each frame refresh, and, thus, changes the pixel brightness. Leakage current also affects the fineness of the display's grayscale. With a low leakage current, finer levels of grayscale can be achieved.

In at least some conventional TFT-EWD display panels, mitigating light leakage is difficult because the cell gap, i.e., a distance between a top support plate of the display and an opposing bottom support plate of the display is relatively large, e.g., greater than 20.0 micrometers. In an attempt to mitigate light leakage, at least some conventional displays include a grid of black matrix material on an inner surface of the top support plate that is aligned with a grid of pixel wall portions at least partially defining an array of pixel regions between the top support plate and the bottom support plate. The black matrix material is configured to absorb light entering the display device so that the light does not propagate into the TFT structure; however, because of this relatively large cell gap, the black matrix grid does not prevent all light from entering the TFT structure from sides or edges of the black matrix material grid. Moreover, in order to suitably protect the TFT structure from harmful exposure to light, a width of the black matrix material extends into or over the respective electrowetting pixel region, limiting an area through which light is able to propagate into the electrowetting pixel region and, as a result, adversely affecting a brightness of the electrowetting pixel region.

An amount of light undesirably entering the TFT structure can be greatly minimized or eliminated by adding a light-absorbing material layer, such as an organic material layer, as described herein, within or over the TFT structure and above the silicon semiconductor layer. More specifically, the organic material layer can be disposed above the semiconductor layer, and on top of the silicon nitride passivation layer disposed on a metal layer including the source and drain for the TFT structure, to prevent or limit light from impinging on a surface of the silicon semiconductor layer. In certain embodiments, the organic material layer has minimum suitable dimensions to extend over a portion of the amorphous silicon semiconductor layer not covered by the source and drain of the metal layer. Additionally, the organic material layer can also extend over at least a portion of the source of the metal layer. For example, the organic material layer can extend over a metal source line extending from the source to a source driver for the respective electrowetting pixel region, as well as the silicon semiconductor layer.

In example embodiments described herein, an electrowetting display device includes a thin film transistor (TFT) structure over a first support plate. The TFT structure includes a first metal layer, including a gate, over the first support plate. A silicon layer, e.g., a silicon semiconductor layer including an amorphous silicon material, is disposed over the gate and a dielectric layer is disposed on the first metal layer. A second metal layer including a source and a drain for the TFT structure is disposed over the silicon layer and the first metal layer. The source and drain are disposed over the silicon layer to cover at least a portion of the silicon layer. A first passivation layer is disposed over the second metal layer and the silicon layer. A contact, such as a contact hole or a piece of conductive material, extends through the first passivation layer. A light-absorbing material layer, such as a suitable organic material layer, e.g., a black matrix organic material layer, is disposed over the silicon layer and, in certain embodiments, over at least a portion of the second metal layer. A third metal layer is disposed on the second passivation layer. The third metal layer is electrically coupled to the drain of the second metal layer through the contact formed through the first passivation layer and forms a reflective layer configured to reflect a portion of light in the electrowetting pixel region. In example embodiments, a suitable dielectric barrier layer is disposed over the third metal layer and a hydrophobic layer is disposed over the dielectric layer. A plurality of pixel wall portions are then disposed or formed over the hydrophobic layer forming a perimeter of the respective electrowetting pixel region. In example embodiments, one or more pixel wall portions are positioned over at least a portion of the TFT structure and, more particularly, over the silicon layer.

Referring now to the figures, FIG. 1 is a cross-sectional view of a portion of an example display device, such as a reflective electrowetting display device 10. FIG. 1 illustrates a portion of an electrowetting pixel region 12 over a first or bottom support plate 14, e.g., positioned between bottom support plate 14 and a second or top support plate, not shown in FIG. 1, opposing bottom support plate 14. Pixel region 12 includes an electrowetting pixel 16 formed over bottom support plate 14 to define display surface area 18, as shown in FIG. 1. A plurality of pixel wall portions 20 is formed over first support plate 14 to form a perimeter of electrowetting pixel region 12. In certain embodiments, a pixel region may include a pixel or a pixel having two or more sub-pixels of a display device. Such pixels or sub-pixels may be the smallest light transmissive, reflective or transflective unit of a display that is individually operable to directly control an amount of light transmission through or reflection from the pixel region. For example, in some embodiments, a pixel may include a red sub-pixel, a green sub-pixel, a blue sub-pixel, and a white sub-pixel for RGBW displays. In other embodiments, a pixel may be a smallest component, e.g., the pixel does not include any sub-pixels.

Reflective electrowetting display device 10 includes a thin film transistor (TFT) structure 22 disposed or formed over first support plate 14 and associated with, e.g., operatively coupled to, pixel region 12. In example embodiments, TFT structure 22 is operatively coupled to a common electrode, not shown in FIG. 1, positioned under the top support plate for creating, in conjunction with the common electrode, a voltage differential between TFT structure 22 and the common electrode to cause displacement of a first liquid, not shown in FIG. 1 for clarity, within electrowetting pixel 16. TFT structure 22 includes a first metal layer 24, e.g., an electrode layer or gate electrode layer that includes a gate 26 and a metal portion 28, disposed on or over first support plate 14. TFT structure 22 is coupled in signal communication with associated electrowetting pixel 16 within electrowetting pixel region 12. In the example embodiment, TFT structure 22 is switched to either select (activate) or deselect (deactivate) associated electrowetting pixel 16 using active matrix addressing, for example.

Figure 2:
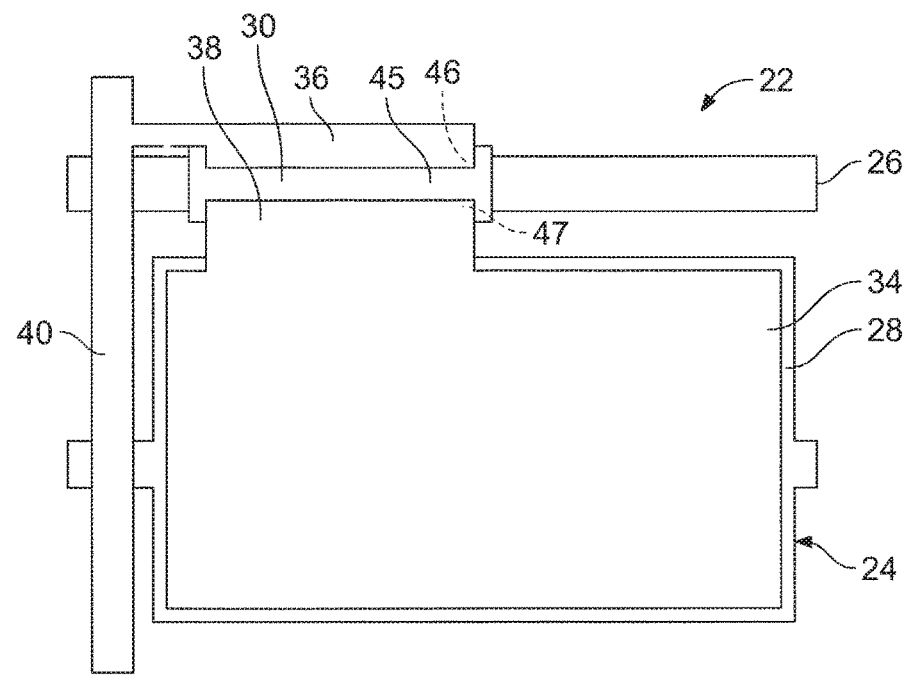
FIG. 2 is a top view of a portion of an electrowetting pixel region during an example fabrication process, according to various embodiments.

Referring additionally to FIG. 2, TFT structure 22 includes a silicon layer, such as a silicon semiconductor layer 30, e.g., a silicon semiconductor layer including an active amorphous silicon, formed on or over, e.g., deposited on, a suitable non-conducting substrate, such as a dielectric layer or first passivation layer 32, shown in FIG. 1, which may include a silicon nitride layer, for example.

A second metal layer 34 is disposed, e.g., formed, on first passivation layer 32 and at least a portion of silicon semiconductor layer 30. Second metal layer 34 includes a suitable metal material, such as ITO. Second metal layer 34 forms a source 36 and a drain 38 of TFT structure 22. Source 36 includes a source line 40, as shown in FIG. 2, to electrically couple source 34 to a respective source driver for transmitting signals to the source driver for driving, e.g., activating or deactivating, a respective electrowetting pixel 16. In example embodiments, source 36 and drain 38 are positioned over silicon semiconductor layer 30 and, in combination, cover a first portion of silicon semiconductor layer 30 leaving a second portion of the silicon semiconductor layer uncovered. A second passivation layer 42, e.g., a passivation layer comprising silicon nitride, is disposed on, e.g., formed or deposited on or over, second metal layer 34. Second passivation layer 42 is made of a suitable material to isolate source 36 and drain 38 from ambient conditions.

Figure 3:
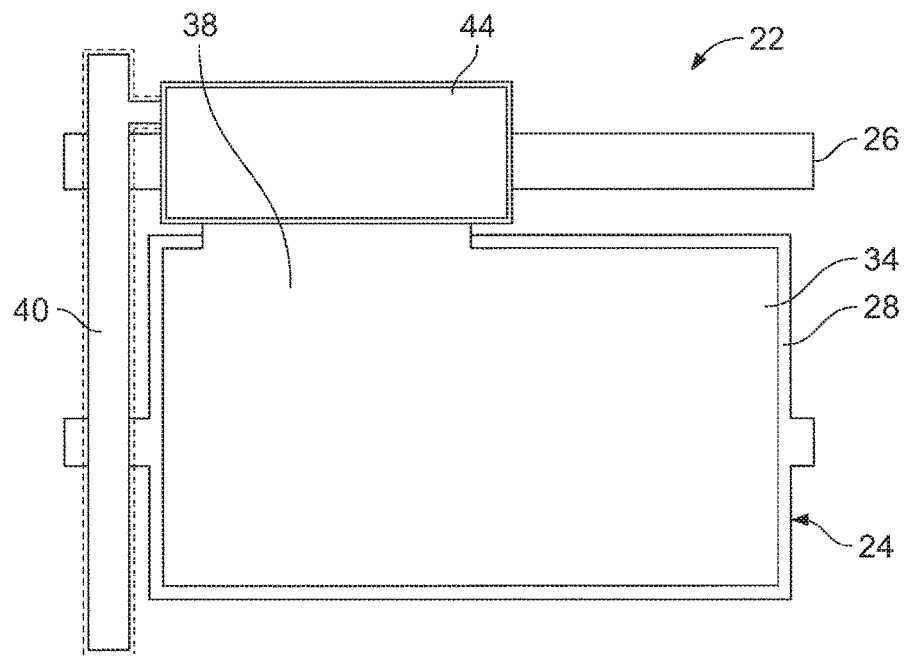
FIG. 3 is top view of a portion of an electrowetting pixel region during a subsequent step of the example fabrication process shown in FIG. 2, according to various embodiments.

Referring additionally to FIG. 3, in example embodiments, a light-absorbing material layer, such as an organic material layer 44, is disposed over at least a portion of second passivation layer 42 and at least a portion of silicon semiconductor layer 30, e.g., a portion of silicon semiconductor layer 30 positioned below or within a conducting channel region 45 as shown in FIG. 2. Conducting channel region 45, formed between source 36 and drain 38, is susceptible to undesirable photoleakage current. In one embodiment, second passivation layer 42 is at least partially positioned on or in conducting channel region 45 and contacts at least a portion of silicon semiconductor layer 30. In the embodiment shown in FIG. 3, organic material layer 44 has suitable dimensions to extend over at least a portion of source 36, at least a portion of drain 38, and silicon semiconductor layer 30 entirely to act as a light shield to protect silicon semiconductor layer 30, which is highly photosensitive, from undesirable exposure to light entering TFT structure 22. In example embodiments, organic material layer 44 is configured to and/or has suitable dimensions to extend over silicon semiconductor layer 30 to absorb light entering TFT structure 22 and prevent or limit light entering pixel region 12 from impinging on a surface of silicon semiconductor layer 30. For example, organic material layer 44 has a length and a width greater than a respective length and width of silicon semiconductor layer 30. More particularly, silicon semiconductor layer 30 has a first width along a width of gate 26 and a first length perpendicular to the first width and organic material layer 44 has a second width along the width of gate 26 greater than the first width and a second length perpendicular to the second width greater than the first length.

In a particular embodiment, organic material layer 44 is disposed over at least a portion of silicon semiconductor layer 30, as shown in FIG. 2, not covered by source 36 and drain 38. As described above, in example embodiments, source 36 and drain 38 cover a first portion of silicon semiconductor layer 30 and organic material layer 44 is positioned over a second portion of silicon semiconductor layer 30, i.e., over conducting channel region 45 between source 36 and drain 38, not covered by source 36 and drain 38. More specifically, in certain embodiments, source 36 at least partially covers a first edge portion 46 of silicon semiconductor layer 30 and drain 38 at least partially covers a second edge portion 47 of silicon semiconductor layer 30 opposite first edge portion 46 to form conducting channel region 45 between source 36 and drain 38.

As described herein, organic material layer 44 may be disposed over silicon semiconductor layer 30 using any suitable process, including without limitation, a photolithography patch coating process, such as a slit coating process, or a printing process, such as an ink jet printing process. Due to processing tolerances, organic material layer 44 may have dimensions greater than the respective dimensions of silicon semiconductor layer 30 by about 2.0 micrometers, or, more particularly, about 1.5 micrometers, for example, to extend over at least conducting channel region 45. As such, in certain embodiments, organic material layer 44 may extend about 1.0 micrometer, or, more particularly, about 0.75 micrometer, beyond each respective end of silicon semiconductor layer 30.

In example embodiments, organic material layer 44 extends over at least a portion of second metal layer 34. For example, in one embodiment, organic material layer 44 is positioned over at least a portion of source 36. More specifically, as shown in FIG. 3, organic material layer 44 extends over source 36 and source line 40 operatively coupling, e.g., electrically coupling, source 36 to respective electrowetting pixel 16. Because source line 40 is made of a metal material, in conventional display devices source line 40 may reflect light, thereby reducing a contrast within electrowetting pixel region 12. With organic material layer 44 over at least a portion of source line 40, light is absorbed by organic material layer 44 rather than reflected by source line 40, resulting in increased contrast exhibited within electrowetting pixel region 12 and increased display performance. Organic material layer 44 may be disposed over silicon semiconductor layer 30 and source 36 as one continuous layer or may include two or more substantially planar layers.

Organic material layer 44 may include any suitable organic material. In example embodiments, organic material layer 44 includes a suitable black matrix material that is disposed over silicon semiconductor layer 30, at least a portion of source 36, and/or at least a portion of drain 38, in certain embodiments, using a suitable deposition process, such as a suitable patch coating or ink jet printing process. In example embodiments, organic material layer 44 is formed of a suitable photoresist material including a black pigment (e.g., a carbon black color pigment) that is formed over silicon semiconductor layer 30 and source 36 to absorb light entering the electrowetting display device and prevent or limit the light from impinging on the electric components, e.g., silicon semiconductor layer 30, source 36, and/or one or more components of TFT structure 22, positioned under or near pixel wall portions 20. An example suitable photoresist material is a negative photosensitive material having a tradename Optmer™ NN Series negative photosensitive material available from JSR Corporation located in Tokyo, Japan. In particular embodiments, organic material layer 44 includes a suitable photovoltaic material, such as poly(3-hexylthiophene) and [6,6]-phenyl C61-butyric acid methylester (P3HT:PCBM) blends or poly[N-900-hepta-decanyl-2,7-carbazole-alt-5,5-(40,70-di-2-thienyl-20,10,30-benzothiadiazole and [6,6]-phenyl C61-butyric acid methylester (PCDTBT:PCBM) blends, having an absorption efficiency of 30% for green light, e.g., light having a wavelength of 525 nanometers to 550 nanometers.

A reflectance of the black matrix material in organic material layer 44 may be adjusted by adjusting an amount of pigment in the black matrix material. For example, reducing the amount of pigment in the black matrix material will lower the reflectance of the black matrix material; however, the absorption or optical density of the black matrix material, determined by the concentration of pigment in the black matrix material, may be negatively affected and the black matrix material may appear gray. To increase a contrast ratio (i.e., a contrast of white to black) in the display, a reflectance of the black matrix material is reduced, while maintaining the absorption level or optical density at a suitable level. In example embodiments, organic material layer 44 has a thickness of at least 1.0 micrometer and, more particularly, a thickness of 1.0 micrometer to 2.0 micrometers, and an optical density of at least 3.0, and, more particularly, an optical density of 4.5. Generally, optical density is a measurement of an extent to which a substance transmits light or other electromagnetic radiation. The optical density is logarithmic. With the black matrix material having an optical density of 3.0, for example, less than 0.1% of light impinging on organic material layer 44 will penetrate and propagate through organic material layer 44 to impinge on the underlying TFT components, and with an optical density of 4.0, less than 0.01% of light impinging on organic material layer 44 will penetrate and propagate through organic material layer 44 to impinge on the underlying TFT components positioned under organic material layer 44. The black matrix material functions to block penetration of light in TFT structure 22 and to minimize an amount of scattered light in electrowetting pixel region 16.

A contact, such as a contact hole 46 or a piece of conductive material is formed through a thickness of second passivation layer 42 to electrically couple a third metal layer, e.g., a reflective layer 48 disposed over, e.g., on, second passivation layer 42 to drain 38 formed in second metal layer 34 positioned under second passivation layer 42. In example embodiments, reflective layer 48 is electrically coupled to drain 38 of second metal layer 34. In certain embodiments, reflective layer 48 can act as a pixel electrode and a reflective layer. In example embodiments, reflective layer 48 may include any suitable material including, for example, a metal (90%, 95% or greater than 95% metal), an alloy, a doped metal, or a dielectric reflective material. Suitable metal materials for reflective layer 48 include, without limitation, aluminum, silver, gold, copper, nickel, platinum, rhodium, lanthanum, and/or silicon nickel. Suitable alloy materials for reflective layer 48 include, without limitation, aluminum with copper or aluminum with nickel. In further alternative embodiments, reflective layer 48 is made of any suitable material providing a desired specular reflectance. In alternative embodiments, reflective layer 48 includes a suitable diffuse reflective material deposited on or over second passivation layer 42. In this alternative embodiment, any suitable diffuse reflective material, such as titanium dioxide ($TiO_2$), providing a desired diffuse reflectance may be used.

Referring further to FIG. 1, one or more dielectric barrier layers 50 may at least partially separate TFT structure 22 from a hydrophobic layer 52. More specifically, in the embodiment shown in FIG. 1, dielectric barrier layer 50 at least partially separates reflective layer 48 from hydrophobic layer 52, such as an amorphous fluoropolymer layer forming a bottom surface of electrowetting pixel 16. For example, dielectric barrier layer 50 may be disposed on, e.g., deposited on, reflective layer 48. Dielectric barrier layer 50 may be formed from various materials including one or more organic material layers or a combination of organic and inorganic material layers. A thickness of the insulating dielectric barrier layer 50 may be less than 2 micrometers and may be less than 1 micrometer; for example, insulating dielectric barrier layer 50 may be 100 nanometers to 800 nanometers in thickness in certain embodiments. In example embodiments, hydrophobic layer 52 is an amorphous fluoropolymer layer including any suitable fluoropolymer(s), such as AF1600® fluoropolymer produced by DuPont based in Wilmington, Del. Hydrophobic layer 52 is transparent in the example embodiments.

An additional organic material layer 60 is formed or disposed on, e.g., deposited on, a portion of dielectric barrier layer 50 near and/or under pixel wall portion 20. Organic material layer 60 may include any suitable organic material including, without limitation, a polyacrylate, an epoxy, or a polyimide material, and combinations thereof.

In example embodiments, one or more pixel wall portions 20 form a patterned electrowetting pixel grid over, e.g., on, hydrophobic layer 52. Pixel wall portions 20 may include a photoresist material such as, for example, an epoxy-based negative photoresist material SU-8. The patterned electrowetting pixel grid includes a plurality of rows and a plurality of columns of pixel wall portions 20 that form a perimeter of each electrowetting pixel region 12 in an array of electrowetting pixel regions 12. Each electrowetting pixel region 12 may have a width and a length in a range of about 50 to 500 micrometers, for example, and, more particularly, in one embodiment, electrowetting pixel regions 12 have a width of 60 micrometers and a height of 120 micrometers.

A first fluid, e.g., a liquid such as an opaque oil, which may have a thickness in a range of 1 micrometer to 10 micrometers, for example, overlays hydrophobic layer 52. The first liquid is partitioned by pixel wall portions 20. A second fluid, e.g., a liquid such as an electrolyte solution, overlays the first liquid and, in certain embodiments, at least a portion of pixel wall portions 20. In certain embodiments, as described above, the second liquid may be electrically conductive and/or polar. For example, the second liquid may be water or a water solution, or a salt solution such as a solution of potassium chloride in water or a mixture of water and ethyl alcohol. In certain embodiments, the second liquid is transparent, but may be colored or absorbing. The first liquid is electrically non-conductive and may, for example, be an alkane-like hexadecane or (silicone) oil. As described herein, the second liquid is immiscible with the first liquid. Light transmission through electrowetting pixel region 12 is controlled by the application of an electric potential to electrowetting pixel 16, which results in a movement of the second fluid into electrowetting pixel 16, thereby displacing the first fluid within electrowetting pixel 16.

As described above, hydrophobic layer 52 is arranged on or over bottom support plate 14 to create an electrowetting surface area. The hydrophobic character of hydrophobic layer 52 causes the first liquid to adjoin preferentially to hydrophobic layer 52 because the first liquid has a higher wettability with respect to a top surface of hydrophobic layer 52 than the second liquid in the absence of a voltage. Wettability relates to the relative affinity of a fluid, e.g., a liquid, for the surface of a solid. Wettability increases with increasing affinity, and it may be measured by the contact angle formed between the fluid and the solid and measured internal to the fluid of interest. For example, such a contact angle may increase from relative non-wettability for a contact angle of more than 90° to complete wettability for a contact angle of 0°, in which case the fluid, e.g., the liquid, tends to form a film on the surface of the solid.

The top support plate, not shown in FIG. 1, covers the second liquid and one or more spacers to maintain the second liquid over electrowetting pixel grid. In one embodiment, the spacers are positioned between the top support plate and pixel wall portions 20. In example embodiments, the spacer is coupled to and extends from the top support plate to contact a contact surface on a first or distal end of one or more corresponding pixel wall portions 20. In certain embodiments, one or more components or layers may be positioned between the top support plate and the spacers. In this arrangement, a contact surface of the spacer contacts a contact surface of corresponding pixel wall portion 20 to provide a stable contact joint at an interface between pixel wall portion 20 and the spacer, providing mechanical strength at the interface that is less sensitive to overflow and/or leakage of the first liquid and/or the second liquid contained within the pixel regions. In alternative embodiments, the spacer does not rest on pixel wall portion 20 but is substantially aligned with pixel wall portion 20. This arrangement may allow the spacer to come into contact with pixel wall portion 20 upon a sufficient pressure or force being applied to the top support plate. Multiple spacers may be interspersed throughout the electrowetting pixel grid. In certain embodiments, one or more color filter layers may be positioned between a second or common electrode and the top support plate. A seal extends about a perimeter of electrowetting display device 10 to contain the first liquid and the second liquid within the fluid region of the cavity. A voltage applied across, among other things, the second liquid and TFT structure 22 of individual electrowetting pixel regions controls transmittance or reflectance of the associated electrowetting pixels 16.

In various embodiments described herein, electronic devices include electrowetting displays (EWDs) for presenting content. In some examples, the electronic devices may include one or more components associated with the electrowetting display, such as a touch sensor component layered atop the electrowetting display for detecting touch inputs, a front light and/or a back light component for lighting the electrowetting display, and/or a cover layer component, which may include anti-glare properties, anti-reflective properties, anti-fingerprint properties, and/or anti-cracking properties, for example.

For a reflective EWD, when the electrowetting pixel is in a resting state (i.e., the closed or off state, with no electric potential applied), the first liquid, e.g., the opaque oil, is distributed throughout the electrowetting pixel to substantially cover a display surface area of the electrowetting pixel. The first liquid absorbs light and the electrowetting pixel in this condition appears dark, e.g., black, in one embodiment. But when the electric potential is applied, the electrowetting pixel is in an active state (i.e., that at least partially open state—the on state—with an electric potential applied), the second liquid moves within the pixel displacing the first liquid so that the first liquid is no longer distributed throughout the pixel. Light can then enter the electrowetting pixel and impinge upon a surface of a reflective portion or layer, for example, positioned at or near a bottom of the electrowetting pixel region. The light is then reflected by the reflective portion or layer to reflect out of the electrowetting pixel region. If the reflective surfaces reflect only a portion of the light spectrum or if color filters are incorporated into the electrowetting pixel structure, the electrowetting pixel may appear to be gray or have color.

A display device, such as an electrowetting display device, may include a transmissive, reflective or transflective display that generally includes an array of pixels (e.g., which may comprise sub-pixels) configured to be operated by an active matrix addressing scheme. For example, rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., TFT structures used as switches) included in each pixel region. The transistors occupy a relatively small fraction of the area of each pixel region to allow light to efficiently pass through (or reflect from) the pixel.

The array of pixels is sandwiched between two support plates, such as a first or bottom support plate and an opposing second or top support plate. The support plates may be made of any suitable material including, without limitation, plastic, glass, quartz, and semiconducting materials, and may be made of a rigid material or a flexible material, for example. The pixel regions include various layers of materials built upon the bottom support plate, e.g., within or under the pixels. One example layer is an amorphous fluoropolymer (AF1600®) with hydrophobic behavior. The pixel walls may be formed on a top surface of the hydrophobic layer. The bottom support plate may be opaque while the top support plate is transparent. Describing a component or material as being "transparent" generally means that the component or the material may transmit a relatively large fraction of the light incident upon it. For example, a transparent material or layer might transmit more than 70% or 80% of the light impinging on its surface, although in other examples a transparent material or structure might transmit a different percentage of incident light. In general, transparent materials or structures need not be perfectly transparent.

Hereinafter, example embodiments include, but are not limited to, reflective electrowetting displays having a clear or transparent top support plate and a bottom support plate, which need not be transparent. In general, "top" and "bottom" may be used to identify opposing support plates of an electrowetting display and do not necessarily refer to a direction referenced to gravity or to a viewing side of the electrowetting display device. In example embodiments, the top support plate is the surface through which pixels of a (reflective) electrowetting display are viewed.

As described above, individual reflective electrowetting pixels may include an electrode layer or gate electrode layer containing or coupled to the drive electronics like TFT structures, source lines, and gate lines on the bottom support plate, a reflective layer over the electrode layer, a pixel electrode adjacent to the reflective layer, a barrier layer on the reflective layer, and a hydrophobic layer on the barrier layer. The pixel electrode in principle is close to the liquids in the pixel to minimize power consumption. In one alternative embodiment, a patterned layer of indium tin oxide (ITO) is deposited as the pixel electrode over the reflective layer. In another alternative embodiment, the pixel electrode is under the reflective layer. The electrode layer, for example, can be an electrode layer containing at least part of the drive electronics if the reflective layer is used as the electrode or the electrode layer can contain the pixel electrodes in contact with the reflective layer. Pixel wall portions of each pixel region, the hydrophobic layer, and the transparent top support plate at least partially enclose a liquid region within the cavity that contains the first liquid which is electrically non-conductive, e.g., an opaque oil retained in the individual electrowetting pixels by pixel wall portions, and the second liquid, e.g., an electrolyte solution, that is electrically conductive or polar and may be a water or a salt solution, such as a solution of potassium chloride in water. The second liquid may be transparent or may be colored. The second liquid is immiscible with the first liquid. In general, substances are "immiscible" with one another if the substances do not substantially form a solution, although in a particular embodiment the second liquid might not be perfectly immiscible with the first liquid. In general, an "opaque" liquid is a liquid that appears black to an observer. For example, an opaque liquid strongly absorbs a broad spectrum of wavelengths (e.g., including those of red, green and blue light) in the visible region of electromagnetic radiation appearing black. However, in certain embodiments an opaque liquid may absorb a relatively narrower spectrum of wavelengths in the visible region of electromagnetic radiation and may not appear perfectly black.

In some embodiments, the opaque liquid is a nonpolar electrowetting oil. In certain embodiments, the first liquid may absorb at least a portion of the visible light spectrum. The first liquid may be transmissive for a portion of the visible light spectrum, forming a color filter. For this purpose, the first liquid may be colored by addition of pigment particles or a dye. Alternatively, the first liquid may be black, for example by absorbing substantially all portions of the visible light spectrum, or reflecting. A reflective first liquid may reflect the entire visible light spectrum, making the layer appear white, or a portion of the entire visible light spectrum, making the layer have a color. In example embodiments, the first liquid is black and, therefore, absorbs substantially all portions of an optical light spectrum.

Spacers and edge seals mechanically couple the first support plate with the overlying, opposing second support plate, forming a separation between the first support plate and the second support plate, and contributing to the mechanical integrity of the electrowetting display device. Spacers can be at least partially transparent so as to not hinder throughput of light in the electrowetting display. The transparency of spacers may at least partially depend on the refractive index of the spacer material, which can be similar to or the same as the refractive indices of surrounding media. Spacers may also be chemically inert to surrounding media. Edge seals, for example, disposed along a periphery of an array of electrowetting pixels, may contribute to retaining liquids (e.g., the first liquid and the second liquid) between the first support plate and the overlying second support plate.

In some embodiments, the electrowetting display device as described herein may be incorporated into a system that includes one or more processors and one or more computer memories, which may reside on a control board, for example. Display software may be stored on the one or more memories and may be operable with the one or more processors to modulate light that is received from an outside source (e.g., ambient room light) or out-coupled from a lightguide of the electrowetting display device. For example, display software may include code executable by a processor to modulate optical properties of individual pixels of the electrowetting display device based at least in part on electronic signals representative of static image and/or video data. The code may cause the processor to modulate the optical properties of pixels by controlling electrical signals (e.g., voltages, currents, and fields) on, over, and/or in layers of the electrowetting display device.

Figure 4:
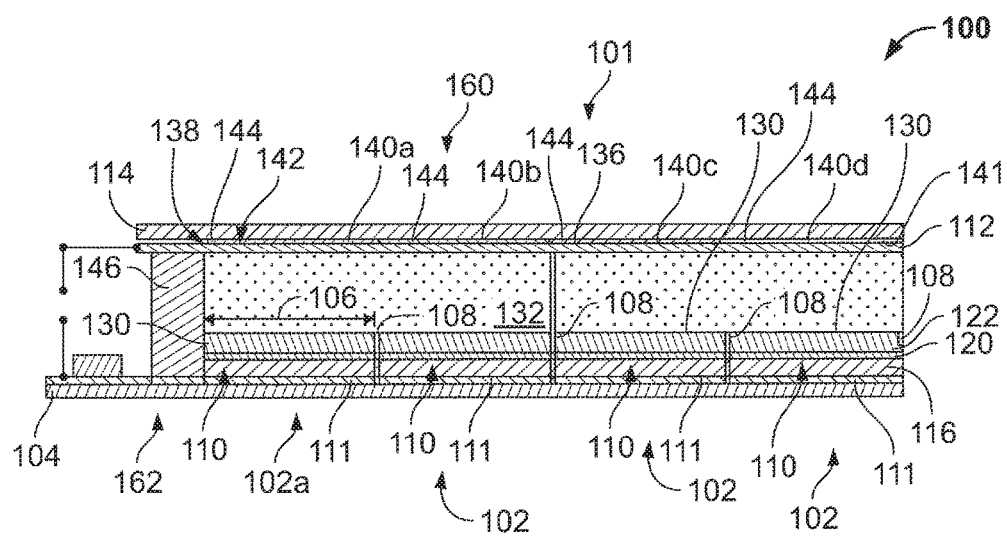
FIG. 4 is a cross-sectional view of an example electrowetting display device, according to various embodiments.
Figure 5:
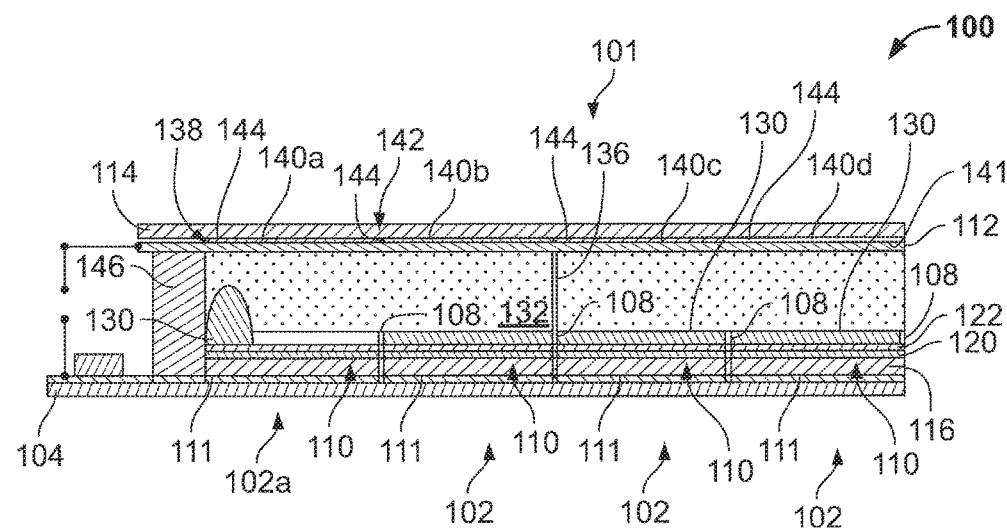
FIG. 5 is a cross-sectional view of the electrowetting display device of FIG. 4 with an activated first pixel, according to various embodiments.
Figure 6:
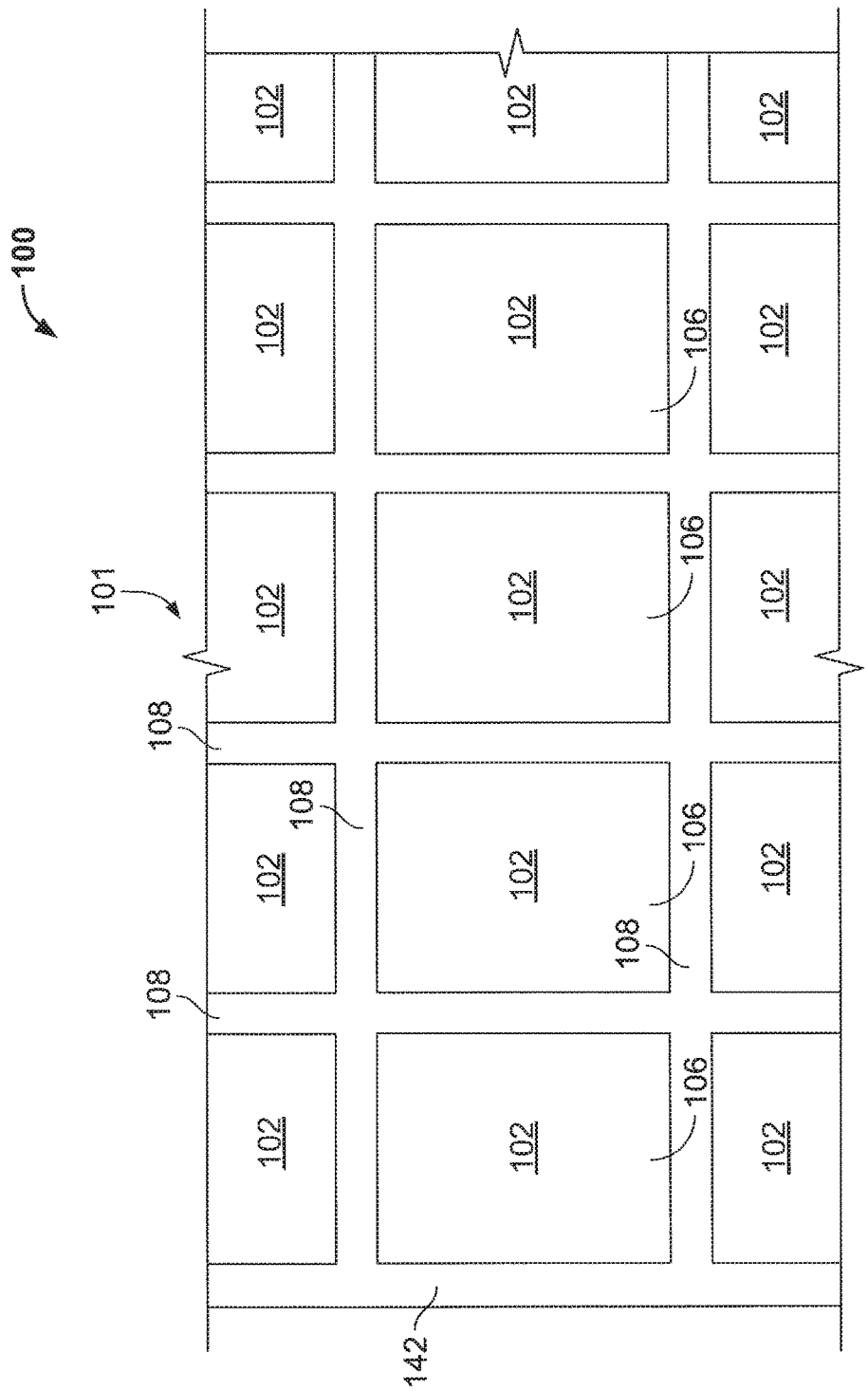
FIG. 6 is a top view of a plurality of electrowetting pixels of an example electrowetting display device, according to various embodiments.

Referring now to FIGS. 4-6, FIG. 4 is a cross-sectional view of a portion of an example reflective electrowetting display device 100 including a pixel grid 101 with several electrowetting pixel regions each including an electrowetting pixel 102. FIG. 5 shows the same cross-sectional view as FIG. 4 in which an electric potential has been applied to one electrowetting pixel 102a causing displacement of a first liquid disposed in electrowetting pixel 102a, as described below. Four complete electrowetting pixels 102 are shown in cross-section in FIGS. 4 and 5. FIG. 6 is a top view of an example reflective electrowetting display device 100 including pixel grid 101 having a plurality of electrowetting pixels 102 formed over a first or bottom support plate 104 (shown in FIGS. 4 and 5). As shown in FIG. 6, each electrowetting pixel 102 defines a display surface area 106. More specifically, in this embodiment, display surface area 106 is defined by pixel wall portions 108, as described below, having a first dimension, such as a width, between opposing lateral pixel wall portions 108, and a second dimension, such as a length, between the remaining opposing pixel wall portions 108. Electrowetting display device 100 may include any number (usually a very large number, such as thousands or millions) of electrowetting pixels 102.

Referring further to FIGS. 4 and 5, a thin film transistor (TFT) structure 110, such as TFT structure 22 described above, includes an electrode layer 111 having a pixel electrode formed on or over bottom support plate 104 and between an associated electrowetting pixel 102 and bottom support plate 104. Electrode layer 111 and/or the pixel electrode is operatively coupled to a second or common electrode 112 positioned under a second or top support plate 114 for creating, in conjunction with common electrode 112, a voltage differential between electrode layer 111 and common electrode 112 to cause displacement of the first liquid, e.g., an oil, within the associated electrowetting pixel 102. These example embodiments are not limiting with respect to the location of the first electrode and the second electrode, and claimed subject matter is not limited in this respect. In particular embodiments, one or more additional layers may be positioned between electrode layer 111 and bottom support plate 104, in which other components or layers of TFT structure 110, gates, and/or source lines are located, for example. In these embodiments, electrode layer 111 may not be formed directly on bottom support plate 104. In various embodiments, electrode layer 111 forms part of TFT structure 110, which can be switched to either select (activate) or deselect (deactivate) corresponding electrowetting pixel 102 using active matrix addressing, for example. A TFT structure is a particular type of field-effect transistor that includes thin films of an active semiconductor layer as well as a dielectric layer and metallic contacts over a supporting (but non-conducting) substrate, which may be glass or any suitable transparent or non-transparent material, for example.

In example embodiments, TFT structure 110 includes a reflective layer 116 positioned over, e.g., on, electrode layer 111, as shown in FIGS. 4 and 5, for example. In particular embodiments, one or more additional layers may be positioned between reflective layer 116 and electrode layer 111. In these embodiments, reflective layer 116 may not be formed directly on electrode layer 111. In an alternative embodiment, reflective layer 116 is positioned under a transparent electrode layer. In this alternative embodiment, reflective layer 116 is positioned between transparent electrode layer 111 and bottom support plate 104. Reflective layer 116 may reflect light within the entire visible spectrum, making the layer appear relatively bright, or reflect a portion of light within the visible spectrum, making the layer have a color. In this embodiment, reflective layer 116 is positioned within the pixel region, e.g., within or under each electrowetting pixel 102, to provide specular reflection.

In example embodiments, reflective layer 116 is positioned over electrode layer 111 within electrowetting pixel 102 or, alternatively, over electrode layer 111 and under electrowetting pixel 102. In certain embodiments, reflective layer 116 is formed or made of any suitable materials including, for example, a metal (90%, 95% or greater than 95% metal), an alloy, a doped metal, or a dielectric reflective material. Suitable metal materials for reflective layer 116 include, without limitation, aluminum, silver, gold, copper, nickel, platinum, rhodium, lanthanum, and/or silicon nickel. Suitable alloy materials for reflective layer 116 include, without limitation, aluminum with copper or aluminum with nickel. In further alternative embodiments, reflective layer 116 is made of any suitable material providing a desired specular reflectance. In alternative embodiments, reflective layer includes a suitable diffuse reflective material deposited on or over electrode layer 111. In this alternative embodiment, any suitable diffuse reflective material, such as titanium dioxide ($TiO_2$), providing a desired diffuse reflectance may be used.

Electrowetting pixels 102 may have specific and/or additional structural features. Additionally or alternatively, reflective layer 116 may have structural features, for example, one or more relatively thinner areas and/or one or more relatively thicker areas within reflective layer 116 to control movement of the fluids. Alternatively, reflective layer 116 may be deposited on a structural feature conforming to a shape of the structural feature.

A suitable dielectric barrier layer 120 may at least partially separate electrode layer 111 from a hydrophobic layer 122, such as an amorphous fluoropolymer layer forming a bottom surface of electrowetting pixel 102 in certain embodiments. For example, dielectric barrier layer 120 may be disposed on, e.g., deposited on, reflective layer 116. Dielectric barrier layer 120 may be formed from various materials including one or more organic material layers or a combination of organic and inorganic material layers. A thickness of the insulating dielectric barrier layer 120 may be less than 2 micrometers and may be less than 1 micrometer; for example, the insulating dielectric barrier layer 120 may be 100 nanometers to 800 nanometers in thickness in certain embodiments. In example embodiments, hydrophobic layer 122 is an amorphous fluoropolymer layer including any suitable fluoropolymer(s), such as AF1600® fluoropolymer produced by DuPont based in Wilmington, Del. Hydrophobic layer 122 is transparent in the example embodiment. As described above, in certain embodiments, reflective layer 116 can act both as a pixel electrode and a reflective layer.

One or more pixel wall portions 108 form patterned electrowetting pixel grid 101 over hydrophobic layer 122. Pixel wall portions 108 may include a photoresist material such as, for example, an epoxy-based negative photoresist material SU-8. Patterned electrowetting pixel grid 101 includes a plurality of rows and a plurality of columns that form an array of electrowetting pixel regions, such as shown in FIG. 6, that may have a width and a height in a range of about 50 to 500 micrometers, for example, and, more particularly, in one embodiment, the electrowetting pixel regions have a width of 60 micrometers and a height of 120 micrometers.

A first liquid 130, which may have a thickness (e.g., a height as shown in FIGS. 4 and 5) in a range of 1 micrometer to 10 micrometers, for example, overlays hydrophobic layer 122. First liquid 130 is partitioned by pixel wall portions 108 of patterned electrowetting pixel grid 101. A second liquid 132, such as an electrolyte solution, overlays first liquid 130 and, in certain embodiments, at least a portion of pixel wall portions 108 of patterned electrowetting pixel grid 101. In certain embodiments, as described above, second liquid 132 may be electrically conductive and/or polar. For example, second liquid 132 may be water or a water solution, or a salt solution such as a solution of potassium chloride in water or a mixture of water and ethyl alcohol. In certain embodiments, second liquid 132 is transparent or may be colored. First liquid 130 is electrically non-conductive and may, for example, be an alkane-like hexadecane or (silicone) oil. As described above, second liquid 132 is immiscible with first liquid 130.

As described above, hydrophobic layer 122 is arranged over bottom support plate 104 to create an electrowetting surface area. The hydrophobic character of hydrophobic layer 122 causes first liquid 130 to adjoin preferentially to hydrophobic layer 122 because first liquid 130 has a higher wettability with respect to a top surface of hydrophobic layer 122 than second liquid 132 in the absence of a voltage. Wettability relates to the relative affinity of a fluid, e.g., a liquid, for the surface of a solid. Wettability increases with increasing affinity, and it may be measured by the contact angle formed between the fluid and the solid and measured internal to the fluid of interest. For example, such a contact angle may increase from relative non-wettability for a contact angle of more than 90° to complete wettability for a contact angle of 0°, in which case the fluid, e.g., the liquid, tends to form a film on the surface of the solid.

Top support plate 114 covers second liquid 132 and one or more spacers 136 to maintain second liquid 132 over electrowetting pixel grid 101. In one embodiment, spacers 136 are positioned between top support plate 114 and pixel wall portion 108. In example embodiments, spacer 136 is coupled to and extends from top support plate 114 to contact a contact surface on a first or distal end of one or more corresponding pixel wall portions 108. In certain embodiments, one or more components or layers may be positioned between top support plate 114 and spacers 136. In this arrangement, a contact surface of spacer 136 contacts a contact surface of corresponding pixel wall portion 108 to provide a stable contact joint at an interface between pixel wall portion 108 and spacer 136, providing mechanical strength at the interface that is less sensitive to overflow and/or leakage of first liquid 130 and/or second liquid 132 contained within the pixel regions. In alternative embodiments, spacer 136 does not rest on pixel wall portion 108 but is substantially aligned with pixel wall portion 108. This arrangement may allow spacer 136 to come into contact with pixel wall portion 108 upon a sufficient pressure or force being applied to top support plate 114. Multiple spacers 136 may be interspersed throughout electrowetting pixel grid 101.

In example embodiments, one or more filter layers 138 including, for example, color filter portions 140a-140d as shown in FIGS. 4 and 5, may be positioned between second electrode 112 and top support plate 114. For example, one color filter layer 138 is disposed on, e.g., formed or deposited on, an inner surface 141 of top support plate 114 using a suitable method. Color filter layer 138 includes a plurality of color filter portions, collectively referred to as color filter portions 140. In example embodiments, filter layer 138 includes a red color filter portion 140a, a green color filter portion 140b, a blue color filter portion 140c, and a transparent (white) color filter portion 140d positioned between second electrode 112 and top support plate 114. Each color filter portion 140 is positioned within a respective pixel region and directly over or aligned with a respective electrowetting pixel 102 within the respective pixel region. Each color filter portion 140 may be configured to be substantially transparent to particular ranges of wavelengths of light, while absorbing others. For example, red color filter portion 140a may be transparent to red light having wavelengths ranging from 620 nanometers (nm) to 750 nm, while absorbing light having other wavelengths. Green color filter portion 140b may be transparent to green light having wavelengths ranging from 495 nm to 570 nm, while absorbing light having other wavelengths. Blue color filter portion 140c may be transparent to blue light having wavelengths ranging from 450 nm to 495 nm, while absorbing light having other wavelengths. Transparent (white) color filter portion 140d may be transparent to all wavelengths of visible light, namely white light. As used herein, visible light refers to wavelengths of electromagnetic radiation visible to the human eye. Generally, this includes electromagnetic radiation having wavelengths between about 400 nm to about 800 nm.

Color filter portions 140, therefore, may be utilized to assign each pixel 102 a color, so that when a particular pixel 102 is in an open state, light reflected by that pixel will take on the color of the color filter associated with that pixel 102. In other embodiments, different ranges of light wavelengths may be associated with the red, green, and blue color filter portions 140. In still other embodiments, color filter portions 140 may be configured to block or transmit electromagnetic radiation of different wavelengths entirely. For example, electrowetting display device 100 may be configured to generate images using pixels 102 having color filter portions 140 configured to transmit electromagnetic radiation of the colors cyan, magenta, and yellow. In short, color filter portions 140 may be developed and utilized within electrowetting display device 100 in accordance with any display color model.

Each pixel 102 is associated with a color filter portion 140. Colors filter portions 140 may be constructed with a generally transparent material such as a photoresist material or photo-definable polymer, including electromagnetic radiation filtering materials suspended within the material. Color filter portions 140 may be formed by the addition of pigments or dyes to a clear photo-definable polymer, for example. The amount of additive depends on system requirements, such as absorbance or transmission specifications. In some cases, polyacrylates are used as photoresist material. General, the organic dyes and pigments used within color filter portions 140 can have molecular structures containing chromophoric groups generating the color filtering properties. Some examples for chromophoric groups are azo-, anthraquinone-, methine- and phtalocyanine-groups. Color filter portions 140 may also be formed using a dichromated gelatin doped with a photosynthesizer, dyed polyimides, resins, and the like.

In a particular embodiment, color filter portions 140 are configured to overlay each pixel 102 so that each color filter portion 140 extends from one pixel wall portion 108 on a first side of pixel 102 to an opposing pixel wall portion 108 on a second side of pixel 102. In one embodiment, electrowetting display device 100 includes a combination of red, blue, green, and white color filter portions 140, with one color filter portion 140 being positioned over each pixel 102. Using color filter portions 140, each pixel 102 in electrowetting display device 100 can be associated with a particular wavelength of electromagnetic radiation. By controlling which pixels 102 are active within electrowetting display device 100, electrowetting display device 100 can generate color images viewable by a user.

In the example embodiment, filter layer 138 includes a black matrix material such as a suitable photoresist material, e.g., one or more black matrix members 142, disposed and positioned around at least a portion of each color filter portion 140 to form a perimeter around at least a portion of the associated color filter portion 140. In example embodiments, the black matrix material is aligned with or positioned directly over pixel wall portions 108. More specifically, a plurality of black matrix members 144 are aligned over the plurality of pixel wall portions and form a black matrix grid. For example, in certain embodiments, each black matrix member 144 is aligned over a respective pixel wall portion 108 of the plurality of pixel wall portions 108. As shown in FIGS. 4 and 5, electrowetting display device 100 includes a black matrix member 144 positioned over first pixel wall portion 108a. More specifically, black matrix member 144 is positioned along an edge of a first color filter, between the first color filter and an adjacent second color filter. Color filter portions 140 are adjacent when they are next to one another in the display device with no intervening color filter portion 140 between. Black matrix member 144 is formed between the first filter and the second color filter such that black matrix member 144 runs along the perimeter between the adjacent color filters. In a particular embodiment, black matrix member 144 has a width between the first color filter and the second color filter of 3.0 micrometers to 10.0 micrometers. In example embodiments, each color filter portion 140a-140d is disposed over or in a respective electrowetting pixel region between black matrix members 144 such that black matrix members 144 form a perimeter of each color filter portion 140a-140d. Referring further to FIGS. 4 and 5, a plurality of pixel wall portions 108 is formed over bottom support plate 104. The plurality of pixel wall portions 108 is associated with a pixel 102 within the pixel region. Each black matrix member 144 is positioned directly over a respective pixel wall portion 108 of the plurality of pixel wall portions 108.

A seal 146 extends about a perimeter of electrowetting display device 100 to contain first liquid 130 and second liquid 132 within the fluid region of the cavity. A voltage applied across, among other things, second liquid 132 and electrode layer 111 of individual electrowetting pixel regions controls transmittance or reflectance of the associated electrowetting pixels 102.

Reflective electrowetting display device 100 has a viewing side 160 corresponding to top support plate 114 through which an image formed by reflective electrowetting display device 100 may be viewed, and an opposing rear side 162 corresponding to bottom support plate 104 as shown, for example, in FIGS. 4 and 5. Reflective electrowetting display device 100 may be a segmented display type in which the image is built of segments. The segments may be switched simultaneously or separately. Each segment includes one electrowetting pixel 102 or a number of electrowetting pixels 102 that may be neighboring or distant from one another. Electrowetting pixels 102 included in one segment are switched simultaneously, for example. Electrowetting display device 100 may also be an active matrix driven display type or a passive matrix driven display, for example.

In an example embodiment, an electrowetting display device includes a first support plate and an opposing second support plate. An electrowetting pixel region is between the first support plate and the second support plate. A plurality of pixel wall portions is formed over the first support plate. The plurality of pixel wall portions forms a perimeter of the electrowetting pixel region. A thin film transistor (TFT) structure is over the first support plate and operatively coupled to the electrowetting pixel region. The TFT structure includes a first metal layer over the first support plate. The first metal layer includes a gate. A dielectric layer is disposed on the first metal layer. An amorphous silicon layer is disposed on the dielectric layer and over the gate. A second metal layer is disposed on the amorphous silicon layer and the dielectric layer. The second metal layer includes a source and a drain. A passivation layer is disposed on the second metal layer. A light-absorbing organic material layer is disposed on the passivation layer and over at least a portion of the source and at least a portion of the drain. The light-absorbing organic material layer is disposed over the amorphous silicon layer and configured to absorb a first portion of light entering the TFT structure. A contact extends through the passivation layer. A third metal layer is disposed on the passivation layer. The third metal layer is electrically coupled to the drain through the contact and forms a reflective layer configured to reflect a second portion of light in the electrowetting pixel region. In a particular embodiment, the source covers a first edge portion of the amorphous silicon layer and the drain covers a second edge portion of the amorphous silicon layer opposite the first edge portion to form a conducting channel region between the source and the drain. The light-absorbing organic material layer is positioned over the conducting channel region. In a particular embodiment, the second metal layer comprises a source line coupling the source to the electrowetting pixel region and the light-absorbing organic material layer extends over the source line.

In another example embodiment, a display device includes a first support plate and a pixel region over the first support plate. A thin film transistor (TFT) structure is disposed over the first support plate and associated with the pixel region. The TFT structure includes a first metal layer over the first support plate. The first metal layer includes a gate. A silicon layer is disposed over the gate. A second metal layer is disposed over the silicon layer. The second metal layer includes a source and a drain covering a first portion of the silicon layer. A light-absorbing material layer is disposed over at least a second portion of the silicon layer. The light-absorbing material layer may also extend over the first portion of the silicon layer. In a particular embodiment, the source covers a first edge portion of the silicon layer and the drain covers a second edge portion of the silicon layer opposite the first edge portion. The source and the drain form a conducting channel region between the source and the drain. The light-absorbing material layer is positioned over the conducting channel region. In certain embodiments, the second metal layer includes a source line to electrically couple the source to the pixel region and the light-absorbing material layer is positioned over the source line.

Figure 7:
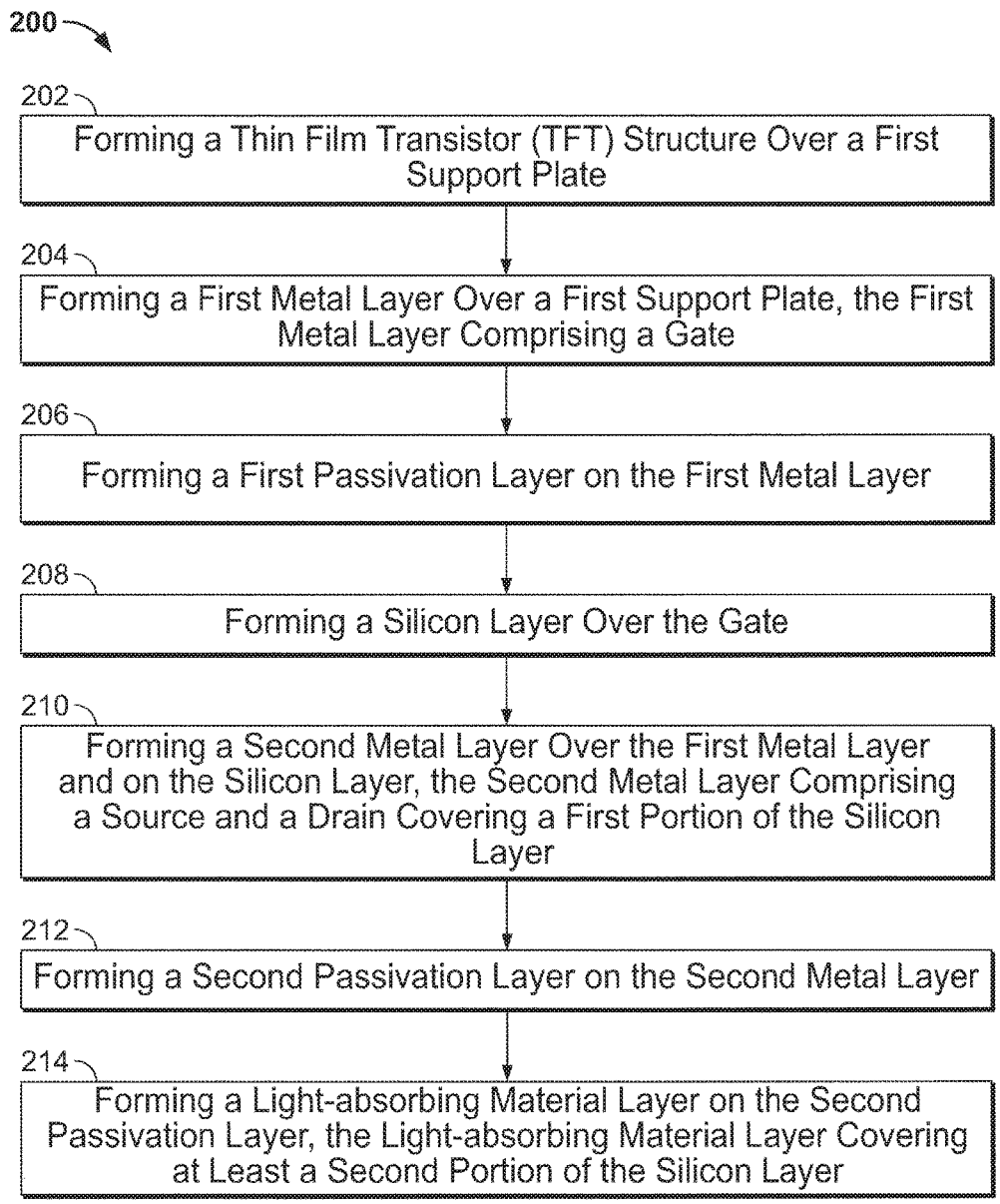
FIG. 7 illustrates an example method for fabricating an example electrowetting display device such as shown in FIGS. 1-6.

FIG. 7 is a flow diagram of an example method 200 for fabricating an electrowetting display device, such as electrowetting display device 10, as shown in FIGS. 1-3, or an electrowetting display device 100 as shown in FIGS. 4-6. Though claimed subject matter is not limited in this respect, method 200 may be performed manually (e.g., by humans) and/or using automated equipment. At block 202, a thin film transistor (TFT) structure is formed over a first support plate. In one embodiment, forming 202 a TFT structure over the first support plate includes forming 204 a first metal layer over the first support plate. The first metal layer includes a gate. In an example embodiment, the first metal layer is deposited on the first support plate using a suitable physical vapor deposition process (PVD) such as sputtering. Additional layers may be positioned between the first metal layer and the first support plate.

At block 206, a first passivation layer, e.g., a dielectric layer, is formed over, e.g., deposited on, the first metal layer. In example embodiments, the first passivation layer includes a suitable silicon nitride layer. Alternatively, the first passivation layer may include SiON, SiO, or TaO, for example. Any suitable deposition technique may be used, such as CVD, PVD, MBE, or a sputtering technique, for example. A silicon layer, e.g., a semiconductor layer, such as a silicon semiconductor layer including an amorphous silicon material, is formed 208 on the first passivation layer and over the gate. A second metal layer is formed 210 over the first metal layer and on the silicon layer. The second metal layer includes a source and a drain covering a first portion of the silicon layer. A second passivation layer is formed 212 on the second metal layer.

At block 214, a light-absorbing material layer, e.g., an organic material layer, is formed on at least a portion of the second passivation layer and over at least a second portion of the silicon layer, e.g., over at least a conducting channel region formed between the source and the drain of the second metal layer. In example embodiments, the organic material layer includes a suitable black matrix material that is disposed over the silicon layer. At least a portion of the source, and/or at least a portion of the drain. In certain embodiments, the light-absorbing material layer is deposited on the second passivation layer and over the silicon layer using a suitable deposition process, such as a suitable a patch coating process, e.g., a slit coating process, or a suitable printing process, e.g., an ink jet printing process.

For example, in one example embodiment, at block 214, a photoresist material is deposited on the second passivation layer and over the silicon layer using a slit coating process. The slit coating process allows for accurately and controllably depositing a layer of the photoresist material having a uniform thickness on the second passivation layer and over at least a portion of the silicon layer. In this example embodiment, the layer of photoresist material has a thickness of at least 1.0 micrometer and, more particularly, a thickness of 1.0 micrometer to 2.0 micrometers. In example embodiments, the photoresist material has an optical density of at least 3.0, and, more particularly, an optical density of 4.5. The photoresist material is patterned to form a patterned photoresist material and the patterned photoresist material is developed to form the organic material layer. In this embodiment, the light-absorbing material layer is formed over the silicon layer, e.g., over at least a portion of the source and at least a portion of the drain, and over the silicon layer. In a particular embodiment, the second metal layer is formed such that the source and the drain cover a first portion of the silicon layer, and the light-absorbing material is formed on the passivation layer over a second portion of the silicon layer, e.g., over the conducting channel region formed between the source and the drain. In example embodiments, the photoresist material includes a black pigment (e.g., a carbon black color pigment) that is formed over silicon semiconductor layer 30 and source 36, for example, to absorb light entering the electrowetting display device and prevent or limit the light from impinging on the electric components, e.g., silicon semiconductor layer 30, source 36, and/or one or more components of TFT structure 22, positioned under or near pixel wall portions 20. As described above, a reflectance of the black matrix material in organic material layer 44 may be adjusted by adjusting an amount of pigment in the black matrix material. In one embodiment, a reflectance of the black matrix material reduced, while maintaining the absorption level or optical density at a suitable level to increase a contrast ratio (i.e., a contrast of white to black) in the display. In an alternative embodiment, the organic material layer 44 is formed using an ink jet printing process.

Referring to FIG. 3, organic material layer 44 has suitable dimensions greater than respective dimensions of the silicon layer, e.g., silicon semiconductor layer 30, to act as a light shield to protect silicon semiconductor layer 30, which is highly photosensitive, from undesirable exposure to light. In a particular embodiment, organic material layer 44 is positioned over at least conducting channel 45, as shown in FIG. 2, not covered by source 36 and drain 38 of second metal layer 34. Due to processing tolerances, organic material layer 44 may extend beyond the respective dimensions of silicon semiconductor layer 30, as described above.

In example embodiments, in block 214, organic material layer 44 extends over at least a portion of second metal layer 34. For example, in one embodiment, organic material layer 44 is positioned over source 36. More specifically, as shown in FIG. 3, organic material layer 44 extends over source 36 and source line 40 operatively coupling source 36 to a respective electrowetting pixel region. By positioning organic material layer 44 over at least a portion of source line 40, light is absorbed by organic material layer 44 rather than reflected by the metal source line, resulting in increased contrast exhibited within the respective electrowetting pixel region and increased display performance. In this embodiment, a source line is formed in the second metal layer to operatively couple, e.g., electrically couple, the source to an associated electrowetting pixel region. The organic material layer is formed on the passivation layer over the source line. As described above, organic material layer 44 may be formed continuously on the passivation layer over silicon semiconductor layer 30 and source 36 as one continuous layer. Alternatively, organic material layer 44 may include two or more substantially planar layers over silicon semiconductor layer 30 and at least a portion of source 36, e.g., source line 40. In an example embodiment, the photoresist material is patterned to form a patterned photoresist material over at least a portion of the source of the second metal layer. The patterned photoresist material is developed to form the organic material layer positioned over at least a portion of the source.

A reflective layer is disposed over, e.g., formed on, the second passivation layer. A contact extends through a thickness of the second passivation layer. In example embodiments, the reflective layer is electrically coupled to the drain formed in the second metal layer positioned under the second passivation layer through the contact. In example embodiments, the reflective layer may include any suitable material including, for example, a metal (90%, 95% or greater than 95% metal), an alloy, a doped metal, or a dielectric reflective material, as described above. In alternative embodiments, the reflective layer includes a suitable diffuse reflective material deposited on or over the second passivation layer.

In certain embodiments, a suitable dielectric barrier layer is formed on or over the reflective layer and over the TFT structure. For example, the dielectric barrier layer may be deposited on the reflective layer. The dielectric barrier layer may be formed from various materials including one or more organic material layers or a combination of organic and inorganic material layers. In certain embodiments, an additional organic material layer, such as organic material layer 60, is formed over, e.g., deposited on, a portion of the dielectric barrier layer near and/or under pixel wall portion 20. The additional organic material layer may include any suitable organic material including, without limitation, a polyacrylate, an epoxy, or a polyimide material, and combinations thereof. A hydrophobic layer, such as an amorphous fluoropolymer layer forming a bottom surface of the electrowetting pixels, is formed over the dielectric barrier layer and, in certain embodiment, over the additional organic material layer. The dielectric barrier layer may at least partially separate the TFT structure from the hydrophobic layer. More specifically, in one embodiment, the dielectric barrier layer at least partially separates the reflective layer from the hydrophobic layer.

In the example embodiment, one or more pixel wall portions 20 form a patterned electrowetting pixel grid over, e.g., on, hydrophobic layer 52. Pixel wall portions 20 may include a photoresist material such as, for example, an epoxy-based negative photoresist material SU-8. The patterned electrowetting pixel grid includes a plurality of rows and a plurality of columns of pixel wall portions 20 that form a perimeter of each electrowetting pixel region 12 in an array of electrowetting pixel regions 12. Each electrowetting pixel region 12 may have a width and a length in a range of about 50 to 500 micrometers, for example, and, more particularly, in one embodiment, electrowetting pixel regions 12 have a width of 60 micrometers and a height of 120 micrometers.

Following formation of the pixel wall portions, a first liquid, such as first liquid 130, and a second liquid, such as second liquid 132, (e.g., the oil and the electrolyte solution) can be disposed in the electrowetting pixel regions of electrowetting display device 100. A second support plate, such as top support plate 114, is coupled to electrowetting display device 100. As shown in FIGS. 4 and 5 for example, top support plate 114 is opposite bottom support plate 104, forming opposing outer surfaces of electrowetting display device 100. The first support plate is then coupled to the second support plate.

In example embodiments, a method for fabricating at least a portion of an electrowetting display device includes forming a first metal layer over a first support plate. The first metal layer includes a gate. A silicon layer is formed over the gate. A second metal layer is formed over the first metal layer and on the silicon layer. The second metal layer includes a source and a drain covering a first portion of the silicon layer. A passivation layer is formed on the second metal layer. A light-absorbing material layer is formed on the passivation layer. The light-absorbing material layer is over at least a second portion of the silicon layer. In one embodiment, forming a light-absorbing material layer on the passivation layer includes forming the light-absorbing material layer over the first portion of the silicon layer. In one embodiment, forming a second metal layer over the first metal layer and on the silicon layer includes forming the source on a first edge portion of the silicon layer and forming the drain on a second edge portion of the silicon layer opposite the first edge portion. The source and the drain form a conducting channel region between the source and the drain, and forming a light-absorbing material layer on the passivation layer includes forming the light-absorbing material layer over at least the conducting channel region.

In certain embodiments, a source line is formed in the second metal layer to operatively couple the source to an associated electrowetting pixel region over the first support plate. The light-absorbing material layer is formed on the passivation layer over the source line. The light-absorbing material layer may be formed continuously on the passivation layer over the silicon layer and the source line.

In certain embodiments, forming a light-absorbing material layer on the passivation layer includes depositing a photoresist material having a thickness of at least 1.0 micrometer on the passivation layer. The photoresist material is patterned to form a patterned photoresist material over the silicon layer. The patterned photoresist material is then developed to form the light-absorbing material layer positioned over the silicon layer. In a particular embodiment, the photoresist material is patterned to form the patterned photoresist material over at least a portion of the source of the second metal layer. The patterned photoresist material is developed to form the light-absorbing material layer positioned over at least a portion of the source.

Figure 8:
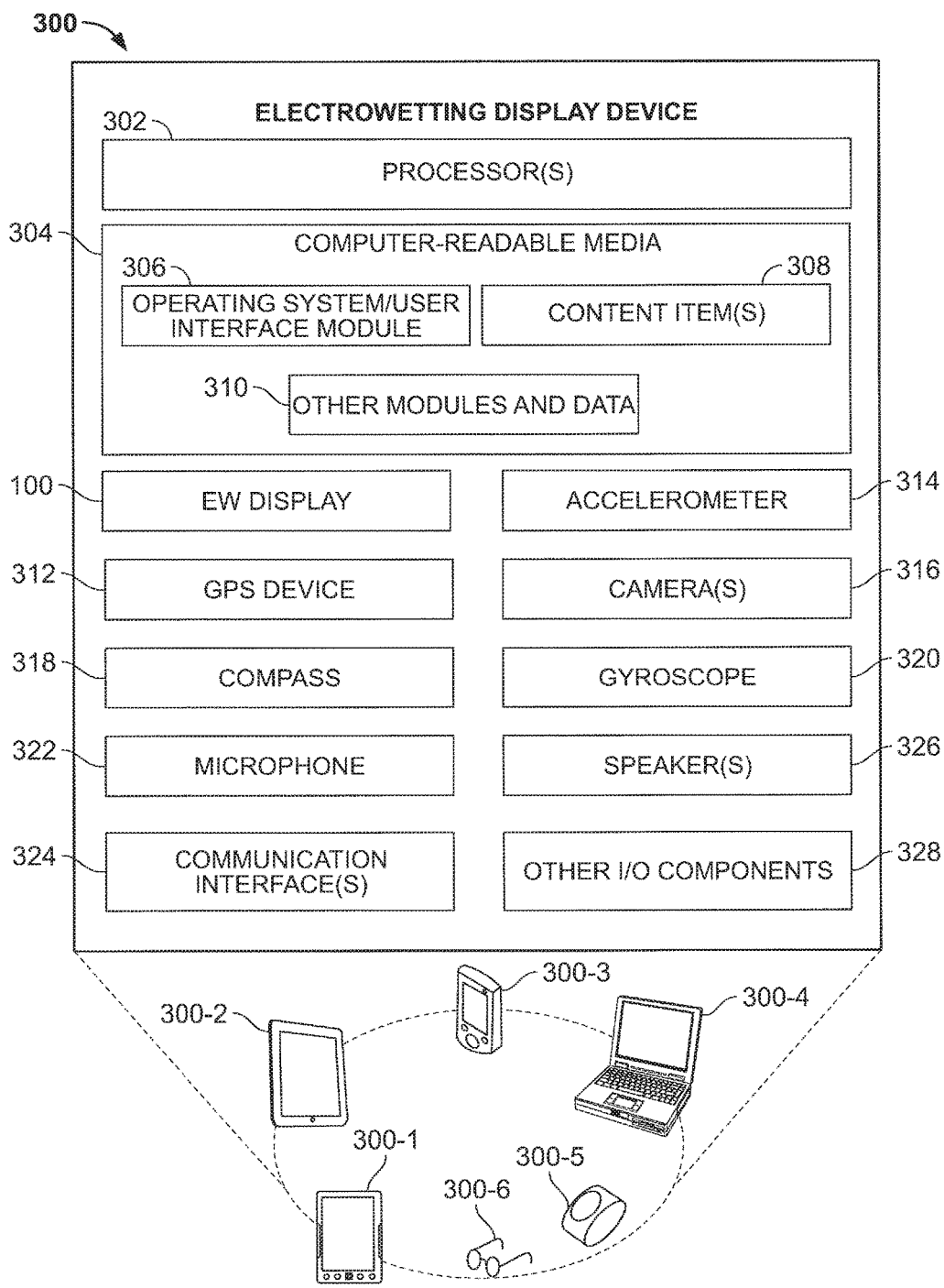
FIG. 8 illustrates an example electronic device that may incorporate an electrowetting display device, according to various embodiments.

FIG. 8 illustrates select example components of an example image display apparatus 300 that may be used with electrowetting display device 100 according to some implementations. Other types of displays may also be used with the example image display apparatus 300. Such types of displays include, but are not limited to, LCDs, cholesteric displays, electrophoretic displays, electrofluidic pixel displays, photonic ink displays, and the like.

Image display apparatus 300 may be implemented as any of a number of different types of electronic devices. Some examples of image display apparatus 300 may include digital media devices and eBook readers 300-1; tablet computing devices 300-2; smart phones, mobile devices and portable gaming systems 300-3; laptop and netbook computing devices 300-4; wearable computing devices 300-5; augmented reality devices, helmets, goggles or glasses 300-6; and any other device capable of connecting with electrowetting display device 100 and including a processor and memory for controlling the display according to the techniques described herein.

In a very basic configuration, image display apparatus 300 includes, or accesses, components such as at least one control logic circuit, central processing unit, or processor 302, and one or more computer-readable media 304. Each processor 302 may itself comprise one or more processors or processing cores. For example, processor 302 can be implemented as one or more microprocessors, microcomputers, microcontrollers, digital signal processors, central processing units, state machines, logic circuitries, and/or any devices that manipulate signals based on operational instructions. In some cases, processor 302 may be one or more hardware processors and/or logic circuits of any suitable type specifically programmed or configured to execute the algorithms and processes described herein. Processor 302 can be configured to fetch and execute computer-readable instructions stored in computer-readable media 304 or other computer-readable media. Processor 302 can perform one or more of the functions attributed to timing controller 102, source driver 104, and/or gate driver 106 of electrowetting display device 100. Processor 302 can also perform one or more functions attributed to a graphic controller (not illustrated) for the electrowetting display device.

Depending on the configuration of image display apparatus 300, computer-readable media 304 may be an example of tangible non-transitory computer storage media and may include volatile and nonvolatile memory and/or removable and non-removable media implemented in any type of technology for storage of information such as computer-readable instructions, data structures, program modules or other data. Computer-readable media 304 may include, but is not limited to, RAM, ROM, EEPROM, flash memory or other computer readable media technology, CD-ROM, digital versatile disks (DVD) or other optical storage, magnetic cassettes, magnetic tape, solid-state storage and/or magnetic disk storage. Further, in some cases, image display apparatus 300 may access external storage, such as RAID storage systems, storage arrays, network attached storage, storage area networks, cloud storage, or any other medium that can be used to store information and that can be accessed by processor 302 directly or through another computing device or network. Accordingly, computer-readable media 304 may be computer storage media able to store instructions, modules or components that may be executed by processor 302.

Computer-readable media 304 may be used to store and maintain any number of functional components that are executable by processor 302. In some implementations, these functional components comprise instructions or programs that are executable by processor 302 and that, when executed, implement operational logic for performing the actions attributed above to image display apparatus 300. Functional components of image display apparatus 300 stored in computer-readable media 304 may include the operating system and user interface module 306 for controlling and managing various functions of image display apparatus 300, and for generating one or more user interfaces on electrowetting display device 100 of image display apparatus 300.

In addition, computer-readable media 304 may also store data, data structures and the like, that are used by the functional components. For example, data stored by computer-readable media 304 may include user information and, optionally, one or more content items 308. Depending on the type of image display apparatus 300, computer-readable media 304 may also optionally include other functional components and data, such as other modules and data 310, which may include programs, drivers and so forth, and the data used by the functional components. Further, image display apparatus 300 may include many other logical, programmatic and physical components, of which those described are merely examples that are related to the discussion herein. Further, while the figures illustrate the functional components and data of image display apparatus 300 as being present on image display apparatus 300 and executed by processor 302 on image display apparatus 300, it is to be appreciated that these components and/or data may be distributed across different computing devices and locations in any manner.

FIG. 8 further illustrates examples of other components that may be included in image display apparatus 300. Such examples include various types of sensors, which may include a GPS device 312, an accelerometer 314, one or more cameras 316, a compass 318, a gyroscope 320, a microphone 322, and so forth.

Image display apparatus 300 may further include one or more communication interfaces 324, which may support both wired and wireless connection to various networks, such as cellular networks, radio, Wi-Fi networks, close-range wireless connections, near-field connections, infrared signals, local area networks, wide area networks, the Internet, and so forth. Communication interfaces 324 may further allow a user to access storage on or through another device, such as a remote computing device, a network attached storage device, cloud storage, or the like.

Image display apparatus 300 may further be equipped with one or more speakers 326 and various other input/output (I/O) components 328. Such I/O components 328 may include a touchscreen and various user controls (e.g., buttons, a joystick, a keyboard, a keypad, etc.), a haptic or tactile output device, connection ports, physical condition sensors, and so forth. For example, operating system 306 of image display apparatus 300 may include suitable drivers configured to accept input from a keypad, keyboard, or other user controls and devices included as I/O components 328. Additionally, image display apparatus 300 may include various other components that are not shown, examples of which include removable storage, a power source, such as a battery and power control unit, a PC Card component, and so forth.

Various instructions, methods and techniques described herein may be considered in the general context of computer-executable instructions, such as program modules stored on computer storage media and executed by the processors herein. Generally, program modules include routines, programs, objects, components, data structures, etc., for performing particular tasks or implementing particular abstract data types. These program modules, and the like, may be executed as native code or may be downloaded and executed, such as in a virtual machine or other just-in-time compilation execution environment. Typically, the functionality of the program modules may be combined or distributed as desired in various implementations. An implementation of these modules and techniques may be stored on computer storage media or transmitted across some form of communication.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular embodiments disclosed, but that such claimed subject matter can also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, devices, or systems that would be known by one of ordinary skill have not been described in detail so as not to obscure claimed subject matter.

Reference throughout this specification to "one embodiment" or "an embodiment" can mean that a particular feature, structure, or characteristic described in connection with a particular embodiment can be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described can be combined in various ways in one or more embodiments. In general, of course, these and other issues can vary with the particular context of usage. Therefore, the particular context of the description or the usage of these terms can provide helpful guidance regarding inferences to be drawn for that context.

What is claimed is:

1. An electrowetting display device, comprising:
    a first support plate and an opposing second support plate;
    an electrowetting pixel region between the first support plate and the second support plate;
    a plurality of pixel wall portions over the first support plate, the plurality of pixel wall portions forming a perimeter of the electrowetting pixel region;
    a thin film transistor (TFT) structure over the first support plate and operatively coupled to the electrowetting pixel region, the TFT structure comprising:
        a first metal layer over the first support plate, the first metal layer comprising a gate;
        a dielectric layer disposed on the first metal layer;
        an amorphous silicon layer disposed on the dielectric layer and over the gate;
        a second metal layer disposed on the amorphous silicon layer and the dielectric layer, the second metal layer comprising a source and a drain;
        a passivation layer disposed on the second metal layer;
        a light-absorbing organic material layer disposed on the passivation layer and over at least a portion of the source and at least a portion of the drain, the light-absorbing organic material layer over the amorphous silicon layer and configured to absorb a first portion of light entering the TFT structure;
        a contact extending through the passivation layer; and
        a third metal layer disposed on the passivation layer, the third metal layer electrically coupled to the drain through the contact and forming a reflective layer configured to reflect a second portion of light in the electrowetting pixel region.

2. The electrowetting display device of claim 1, wherein the source covers a first edge portion of the amorphous silicon layer and the drain covers a second edge portion of the amorphous silicon layer opposite the first edge portion to form a conducting channel region between the source and the drain, and the light-absorbing organic material layer is positioned over the conducting channel region.

3. The electrowetting display device of claim 1, wherein the second metal layer comprises a source line coupling the source to the electrowetting pixel region, and the light-absorbing organic material layer extends over the source line.

4. A display device, comprising:
    a first support plate;
    a pixel region over the first support plate;
    a thin film transistor (TFT) structure over the first support plate and associated with the pixel region, the TFT structure comprising:
        a first metal layer over the first support plate, the first metal layer comprising a gate;
        a silicon layer over the gate;
        a second metal layer over the silicon layer, the second metal layer comprising a source and a drain covering a first portion of the silicon layer; and
        a light-absorbing material layer over at least a second portion of the silicon layer.

5. The display device of claim 4, wherein the light-absorbing material layer extends over the first portion of the silicon layer.

6. The display device of claim 4, wherein the source covers a first edge portion of the silicon layer and the drain covers a second edge portion of the silicon layer opposite the first edge portion, the source and the drain forming a conducting channel region between the source and the drain, and the light-absorbing material layer is positioned over the conducting channel region.

7. The display device of claim 4, wherein the second metal layer further comprises a source line to electrically couple the source to the pixel region, and the light-absorbing material layer is positioned over the source line.

8. The display device of claim 4, wherein the light-absorbing material layer comprises an organic material having an optical density of at least 3.0.

9. The display device of claim 4, wherein the light-absorbing material layer has a thickness of at least 1.0 micrometer.

10. The display device of claim 4, wherein the TFT structure further comprises:
    a passivation layer between the second metal layer and the light-absorbing material layer, the passivation layer at least partially covering the second portion of the silicon layer;
    a contact extending through a thickness of the passivation layer; and
    a reflective layer disposed on the passivation layer, the reflective layer electrically coupled to the drain through the contact.

11. The displayed device of claim 4, further comprising:
    a dielectric barrier layer disposed on the TFT structure;
    an organic material layer disposed on a portion of the dielectric barrier layer; and
    a hydrophobic layer disposed on the organic material layer and the dielectric barrier layer.

12. The display device of claim 4, further comprising:
    a plurality of pixel wall portions over the first support plate, the plurality of pixel wall portions forming a perimeter of the pixel region, wherein the TFT structure is at least partially positioned in the pixel region; and
    a filter layer on a second support plate opposing the first support plate, the filter layer comprising:
        a plurality of color filter portions, wherein a first color filter portion of the plurality of color filter portions is positioned in the pixel region; and
        a light-absorbing member positioned along an edge of the first color filter portion between the first color filter portion and an adjacent second color filter portion of the plurality of color filter portions, wherein the light-absorbing member is positioned over a first pixel wall portion of the plurality of pixel wall portions.

13. An electrowetting display device, comprising:
    a first support plate;

a first metal layer over the first support plate, the first metal layer comprising a gate;

a silicon layer over the gate;

a second metal layer over the first metal layer and on the silicon layer, the second metal layer comprising a source and a drain covering a first portion of the silicon layer;

a passivation layer on the second metal layer; and a light-absorbing material layer on the passivation layer, the light-absorbing material layer over at least a second portion of the silicon layer.

14. The electrowetting display device of claim 13, wherein the light-absorbing material layer is over the first portion of the silicon layer.

15. The electrowetting display device of claim 13, wherein the source is on a first edge portion of the silicon layer and the drain is on a second edge portion of the silicon layer opposite the first edge portion, the source and the drain forming a conducting channel region between the source and the drain, and the light-absorbing material layer is over at least the conducting channel region.

16. The electrowetting display device of claim 13, further comprising:

a source line in the second metal layer, the source line operatively coupling the source to an associated electrowetting pixel region over the first support plate, wherein the light-absorbing material layer is on the passivation layer over the source line.

17. The electrowetting display device of claim 16, wherein the light-absorbing material layer is formed continuously on the passivation layer over the silicon layer and the source line.

18. The electrowetting display device of claim 13, wherein a photoresist material having a thickness of at least 1.0 micrometer is on the passivation layer, wherein the photoresist material forms the light-absorbing material layer over the silicon layer.

19. The electrowetting display device of claim 18, wherein the photoresist material is over at least a portion of the source of the second metal layer and forms the light-absorbing material layer, the light-absorbing material layer over at least a portion of the source.

20. The electrowetting display device of claim 13, further comprising:

a reflective layer on the passivation layer, wherein a contact extends through the passivation layer to provide electrical coupling between the reflective layer and the drain;

a dielectric barrier layer over the TFT structure;

an organic material layer over a portion of the dielectric barrier layer; and a hydrophobic layer over the organic material layer and the dielectric barrier layer.

\* \* \* \* \*